US009131632B2

(12) United States Patent
Moedinger

(10) Patent No.: US 9,131,632 B2
(45) Date of Patent: Sep. 8, 2015

(54) RELIEF PLUG-IN CONNECTOR AND MULTILAYER CIRCUIT BOARD

(75) Inventor: Roland Moedinger, Weinstadt (DE)

(73) Assignee: ERNI Production GmbH & Co. KG, Adelberg (DE)

( * ) Notice: Subject to any disclaimer, the term of this patent is extended or adjusted under 35 U.S.C. 154(b) by 296 days.

(21) Appl. No.: 13/514,347

(22) PCT Filed: Dec. 3, 2010

(86) PCT No.: PCT/DE2010/001405
§ 371 (c)(1),
(2), (4) Date: Jun. 8, 2012

(87) PCT Pub. No.: WO2011/069485
PCT Pub. Date: Jun. 16, 2011

(65) Prior Publication Data
US 2012/0244753 A1    Sep. 27, 2012

(30) Foreign Application Priority Data
Dec. 8, 2009   (DE) .......................... 10 2009 057 260

(51) Int. Cl.
H01R 12/00 (2006.01)
H05K 3/30 (2006.01)
(Continued)

(52) U.S. Cl.
CPC .............. *H05K 3/308* (2013.01); *H01R 12/585* (2013.01); *H01R 12/724* (2013.01);
(Continued)

(58) Field of Classification Search
CPC .................................................. H01R 12/585
USPC ........................ 439/60, 285, 924.1
See application file for complete search history.

(56) References Cited

U.S. PATENT DOCUMENTS 5,543,586 A * 8/1996 Crane et al. .................... 174/262
5,691,209 A * 11/1997 Liberkowski .................... 438/10
(Continued)

FOREIGN PATENT DOCUMENTS

DE   198 07 713    6/1999
DE   699 15 882    3/2005
(Continued)

OTHER PUBLICATIONS

International Search Report of PCT/DE2010/001405, date of mailing Apr. 19, 2011 (ISR).
(Continued)

*Primary Examiner* — James Harvey
(74) *Attorney, Agent, or Firm* — Collard & Roe, P.C.

(57) ABSTRACT

A multipole relief plug-in Connector includes contact elements, the contacting sections of which are arranged in height-offset contact area surfaces, and a multilayer circuit board includes several height-offset contact area surfaces accordingly. In combination, the multipole relief plug-in connector contacts the multilayer circuit board and the multilayer circuit board populates the multipole relief plug-in connector. The contact elements of the relief plug-in connector are designed in the contacting section as press-in contacts for pressing into press-in contact receiving portions of the multilayer circuit board. Contact element receiving portions of the multilayer circuit board are arranged in the contact area surfaces of the multilayer circuit board, the contact element receiving portions being designed as press-in contact receiving portions. A production method produces the multilayer circuit board.

5 Claims, 6 Drawing Sheets

(51) Int. Cl.
*H01R 12/58* (2011.01)
*H01R 12/72* (2011.01)
*H01R 13/6587* (2011.01)
*H05K 1/02* (2006.01)

(52) U.S. Cl.
CPC ......... *H01R 13/6587* (2013.01); *H05K 1/0245* (2013.01); *H05K 1/0251* (2013.01); *H05K 2201/09845* (2013.01); *H05K 2201/1059* (2013.01); *H05K 2201/10189* (2013.01); *H05K 2201/10401* (2013.01); *H05K 2203/0242* (2013.01); *Y10T 29/49126* (2015.01)

(56) References Cited

U.S. PATENT DOCUMENTS

| | | | |
|---|---|---|---|
| 5,961,349 | A | 10/1999 | Paagman |
| 6,129,591 | A | 10/2000 | Czeschka |
| 6,394,822 | B1 | 5/2002 | McNamara |
| 6,817,870 | B1* | 11/2004 | Kwong et al. .................. 439/74 |
| 6,935,870 | B2 | 8/2005 | Kato et al. |
| 6,976,886 | B2* | 12/2005 | Winings et al. ............... 439/701 |
| 7,112,067 | B1* | 9/2006 | Korsunsky et al. ............ 439/65 |
| 7,192,320 | B2 | 3/2007 | Yasumura et al. |
| 7,278,855 | B2* | 10/2007 | Yasumura et al. ............. 439/65 |
| 7,513,797 | B2 | 4/2009 | Scherer et al. |
| 7,621,760 | B1 | 11/2009 | Barr et al. |
| 7,651,382 | B2* | 1/2010 | Yasumura et al. ............ 439/862 |
| 7,878,854 | B2* | 2/2011 | Morgan et al. ........... 439/607.39 |
| 2005/0239300 | A1 | 10/2005 | Yasumura et al. |
| 2006/0073709 | A1* | 4/2006 | Reid ............................. 439/65 |
| 2007/0296066 | A1 | 12/2007 | Shuey |
| 2008/0176452 | A1* | 7/2008 | Fedder et al. ................. 439/638 |
| 2008/0248659 | A1* | 10/2008 | Cohen et al. .................... 439/59 |
| 2009/0093173 | A1 | 4/2009 | Yasumura et al. |
| 2010/0015822 | A1* | 1/2010 | Morgan et al. .................. 439/83 |
| 2012/0244753 | A1* | 9/2012 | Moedinger .................. 439/626 |

FOREIGN PATENT DOCUMENTS

| | | |
|---|---|---|
| JP | 2002-334748 A | 11/2002 |
| JP | 2005-235963 A | 9/2005 |
| JP | 2007-525808 A | 9/2007 |
| WO | WO 2007/144428 | 12/2007 |
| WO | WO 2010/011255 | 1/2010 |

OTHER PUBLICATIONS

German Office Action in DE 10 2009 057 260.0 dated May 21, 2010, with English translation of relevant parts (GPTO).

Meinke and Gundlach "Taschenbuch für Hochfrequenztechnik [Handbook for High-Frequency Technology]", Springer Verlag 1956, pp. 6-15, 48-49, and 158-169. (Spec., pp. 2-3 and 9-10), Year known to be 1956 and month unknown.

Japanese Office Action mailed Aug. 5, 2014 in Japanese Application No. 2012-542361.

* cited by examiner

RELIEF PLUG-IN CONNECTOR AND MULTILAYER CIRCUIT BOARD

CROSS REFERENCE TO RELATED APPLICATIONS

This application is the National Stage of PCT/DE2010/001405 filed on Dec. 3, 2010, which claims priority under 35 U.S.C. §119 of German Application No. 10 2009 057 260.0 filed on Dec. 8, 2009, the disclosure of which is incorporated by reference. The international application under PCT article 21(2) was not published in English.

PRIOR ART

The invention relates to a multipolar relief plug-in connector for contacting with a multilayer circuit board, to a multilayer circuit board to be equipped with a multipolar relief plug-in connector, and to a combination of a multipolar relief plug-in connector and a multilayer circuit board provided to be equipped with the multipolar relief plug-in connector.

Furthermore, the invention relates to a production method for the multilayer circuit board.

A backplane implemented as a multilayer circuit board is known from patent specification U.S. Pat. No. 5,543,586 A, which can be soldered to pins of contact elements. The contact elements can be assembled into groups of four. The individual contact elements of the groups of four can be soldered both to a single layer of the multilayer circuit board and also to layers of the multilayer circuit board located farther underneath.

A backplane which is implemented as a multilayer circuit board is described in patent specification U.S. Pat. No. 7,278,855 B2. The circuit board can have multiple contact area surfaces for contact elements, for example, a first contact area surface in the middle of the backplane and a second contact area surface on the edge of the backplane.

U.S. Pat. No. 7,192,320 B2 and published application US 2009/0093173 A1 describe a multilayer circuit board, which can also have multiple contact area surfaces, the contact area surfaces being provided on individual layers of the multilayer circuit board, so that the contact area surfaces form a stepped structure. For example, in this case a contact area arranged in the middle area of the circuit board is provided with stepped formations on both sides and the contact area arranged on the edge is provided with a stepped formation on one side. The contact areas can be implemented with exclusively falling or rising steps, but also with both rising and also falling steps. Different contact areas can be connected via cables, which correspondingly have contact areas arranged in steps for contacting the stepped contact areas provided in the backplane. Furthermore, relief plug-in connectors are described, which are provided for contacting contact surfaces arranged on the contact area surfaces. The contacting sections of the contact elements of the relief plug-in connector are pressed onto the contact surfaces arranged on the contact area surfaces to produce the contact. The contacting sections of the contact elements can alternatively also be soldered to the contact surfaces arranged on the individual steps.

A plug connector is described in patent specification DE 699 15 882 T2, which is suitable for high-frequency data transmission. A contact element which conducts a shielding or ground potential is assigned to every contact element which conducts a signal. The contact elements are aligned in such a manner that an impedance adaptation is made possible.

A plug connector is described in patent specification U.S. Pat. No. 6,976,886 B2, in which, through a special arrangement and alignment of the contact elements conducting the signal and the contact elements conducting the shielding or ground potential, respectively, to one another, a high shielding effect of the lines conducting the signal to one another and of the plug connect or as a whole is to be achieved. The known plug connector is especially suitable for high-frequency signals, the arrangement of the contact elements conducting the signal and the contact elements conducting the ground potential additionally being specially predefined to achieve a specific wave impedance.

A plug connector is described in published application DE 198 07 713 A1, which contains a large number of contact elements. The known plug connector is provided for producing plug connections between backplanes and plug-in cards, in the specific exemplary embodiment, plug connections being produced between backplanes and plug-in cards of so-called CompactPCI systems.

In the textbook by Meinke and Gundlach "Taschenbuch für Hochfrequenztechnik [Handbook for High-Frequency Technology]", Springer Verlag 1956, pages 6-15, 48-49, and 158-169, basic terms of electrical engineering such as capacitance, inductance, and wave impedance are explained.

The invention is based on the object of respectively specifying a multipolar relief plug-in connector for contacting with a multilayer circuit board, a multilayer circuit board to be equipped with a multipolar relief plug-in connector, a combination of a multipolar relief plug-in connector and a multilayer circuit board provided to be equipped with the multipolar relief plug-in connector, and a production method for the multilayer circuit board, which allow reliable contacting at low manufacturing costs.

The objects are respectively achieved by the features specified in the independent claims.

SUMMARY OF THE INVENTION

The multipolar relief plug-in connector for contacting with a multilayer circuit board proceeds from a plurality of contact elements, which are arranged in height-offset contact area surfaces. The relief plug-in connector according to the invention is distinguished in that the contacting sections of the contact elements are implemented as press-in contacts to be pressed into press-in contact receptacles of a multilayer circuit board.

The relief plug-in connector according to the invention can be contacted particularly simply and in particular cost-effectively with the multilayer circuit board using the measure provided according to the invention. Previously provided soldering and the thermal stress accompanying it of both the relief plug-in connectors and also the multilayer circuit boards are omitted completely.

The press-in contacts can be produced particularly simply by stamping, a springy element arising in the contacting section, which forms the press-in contact.

Advantageous embodiments and refinements of the relief plug-in connector according to the invention result from dependent claims.

An advantageous embodiment provides that the contacting sections of the contact elements are implemented as equally long. The uniform embodiment allows particularly efficient manufacturing of the press-in contacts.

Another embodiment provides that the press-in contacts are arranged adjacent to one another in an imaginary connecting line and preferably respectively form signal press-in contact pairs arranged adjacent. The signal press-in contact pairs are particularly suitable for conducting differential signals due to the resulting symmetrical structure.

A refinement of this embodiment provides that at least one shielding press-in contact arranged adjacent is assigned to the press-in contact pairs. The at least one shielding press-in contact is preferably arranged laterally offset in relation to the respectively assigned signal press-in contact pairs in such a manner that it does not lie on the signal press-in contact pair connecting line.

The structure thus resulting can be implemented having a predefined wave impedance by predefined geometric relationships and with incorporation of the provided dielectric material. A high signal integrity is achieved, whereby the relief plug-in connector according to the invention is suitable in particular for conducting high-frequency signals up to well into the gigahertz range.

The multilayer circuit board according to the invention to be equipped with a multipolar relief plug-in connector proceeds from the idea that the multilayer circuit board has multiple height-offset contact area surfaces. The multilayer circuit board according to the invention is distinguished in that contact receptacles, which are implemented as press-in contact receptacles, are respectively arranged in the contact area surfaces.

The multilayer circuit board according to the invention is especially embodied to be suitable for being equipped with the plug-in connector according to the invention.

Advantageous embodiments and refinements also result here from the dependent claims.

One embodiment provides that electrically conductive bushes for electrical contacting with the press-in contacts of the relief plug-in connector are introduced into the press-in contact receptacles. The bushes are particularly mechanically robust and allow both secure mechanical and also electrical contacting.

One embodiment provides that at least some bushes extend over the entire height of the multilayer circuit board. The comparatively large electrically conductive surface results in a good shielding effect, because of which these bushes are provided in particular for contacting with the shielding press-in contacts of the relief plug-in connector.

One embodiment provides that the links of the bushes are fixed at predefined values. In this case, the bushes are provided in particular for contacting with signal press-in contact pairs, the symmetrical line guiding being in the foreground. The short bushes minimize the undesired capacitances occurring between the press-in contact receptacles.

The combination according to the invention of at least one multipolar relief plug-in connect or and one multilayer circuit board presumes that the relief plug-in connector has a plurality of contact elements, whose contacting sections are arranged in height-offset contact area surfaces, and the multilayer circuit board also has multiple height-offset contact area surfaces. The combination is distinguished in that the contact elements of the relief plug-in connector in the contacting section are implemented as press-in contact elements to be pressed into press-in contact receptacles of the multilayer circuit board, and contact receptacles, which are implemented as press-in contact receptacles, are arranged in the contact area surfaces of the multilayer circuit board.

The combination according to the invention unifies the above-described advantages of the individual components of the combination.

The method according to the invention, which is also provided, for producing a multilayer circuit board to be equipped with at least one relief plug-in connector, the multilayer circuit board having multiple height-offset contact area surfaces, provides that press-in contact receptacles are arranged in the contact area surfaces, which are produced by means of bores, electrically conductive bushes are introduced into the bores, the bushes are drilled out from the equipping side of the multilayer circuit board to the heights of the respectively provided contact area surfaces, and subsequently the contact area surfaces of the multilayer circuit board located at different heights are produced.

The production method according to the invention allows efficient manufacturing of the multilayer circuit board according to the invention.

One embodiment of the production method according to the invention provides that at least some bushes are additionally drilled out from the rear side of the multilayer circuit board, opposite to the equipping direction of the multilayer circuit board, so that the bushes have a predefined length which is less than the height of the respective contact area surface of the multilayer circuit board. This procedure is applied in particular in the case of bushes which are provided for contacting with the signal press-in contact pairs.

Further advantageous refinements and embodiments of the relief plug-in connector according to the invention, the multilayer circuit board according to the invention, the combination of relief plug-in connector and multilayer circuit board, and the production method according to the invention of the multilayer circuit board result from the following description.

DESCRIPTION OF EMBODIMENTS

Figure 1:
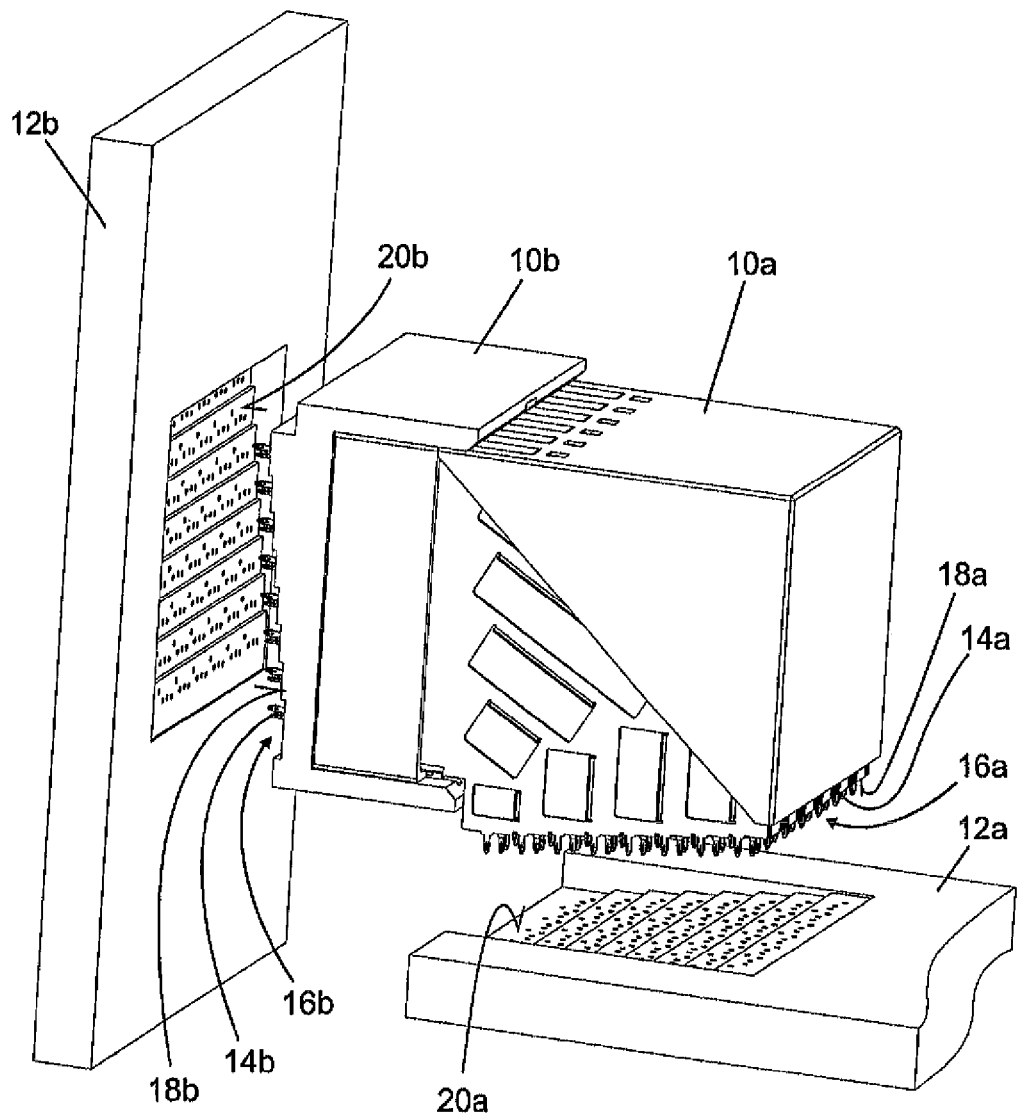
FIG. 1 shows a view of relief plug-in connectors according to the invention before the contacting with multilayer circuit boards according to the invention.

FIG. 1 shows a view of relief plug-in connectors 10a, 10b according to the invention before the contacting with multilayer circuit boards 12a, 12b according to the invention. In this case, a relief plug-in connector 10a according to the invention is implemented as a female connector and a corresponding relief plug-in connector 10b is implemented as a male header, which are both shown in the plugged-in state. The multilayer circuit board 12a is implemented as a daughter card and the multilayer circuit board 12b is implemented as a backplane, for example.

The relief plug-in connectors 10a, 10b according to the invention each have a plurality of contact elements 14a, 14b, whose contacting sections 16a, 16b are arranged in respectively arranged height-offset contact area surfaces 18a, 18b.

The multilayer circuit boards 12a, 12b according to the invention each have contact area surfaces 20a, 20b corresponding to the contact area surfaces 18a, 18b of the relief plug-in connectors 10a, 10b.

The respectively arranged height-offset contact area surfaces 18a, 18b, 20a, 20b form stepped arrangements, which gives the visual impression of a relief, because of which the plug connectors 10a, 10b are designated as relief plug-in connectors 10a, 10b.

Figure 2:
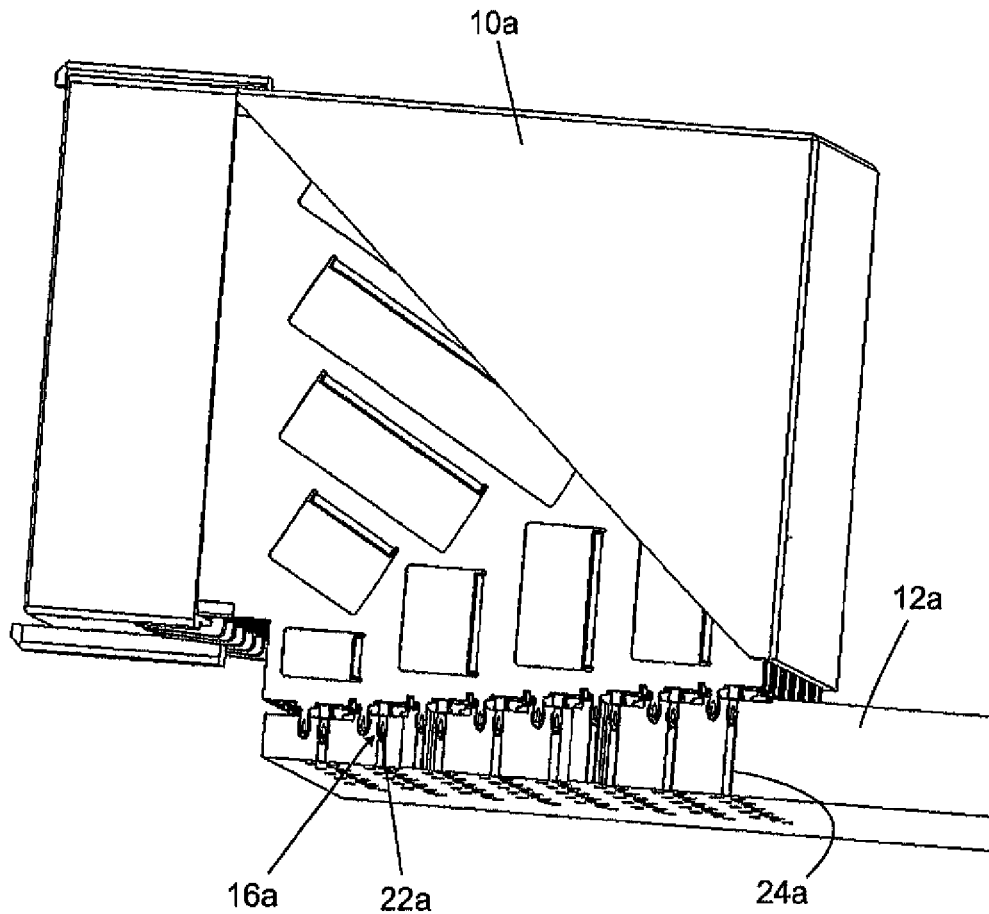
FIG. 2 shows a longitudinal section through a multilayer circuit board according to the invention, which is contacted with a relief plug-in connector according to the invention embodied as a female connector.
Figure 3:
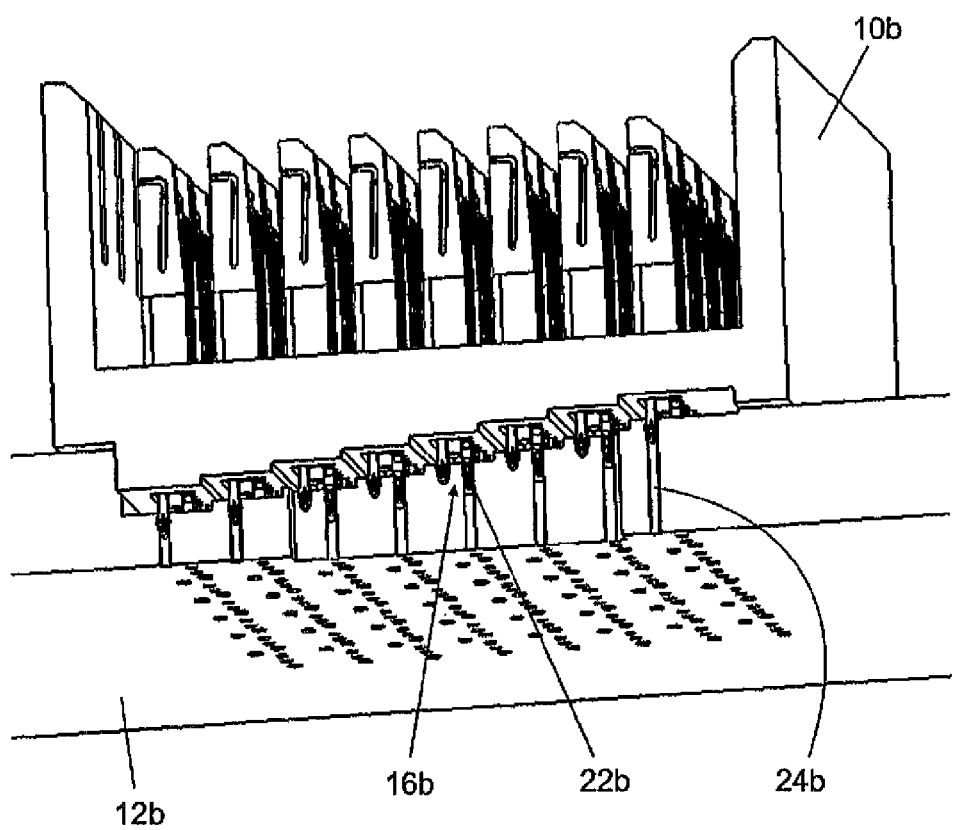
FIG. 3 shows a longitudinal section through a multilayer circuit board according to the invention, which is contacted with a relief plug-in connector according to the invention embodied as a male header.

FIG. 2 shows a longitudinal section through the multilayer circuit board 12a, 12b according to the invention, which is contacted with the relief plug-in connector 10a according to the invention, embodied as a female connector, and FIG. 3 shows a longitudinal section through the multilayer circuit board 12b according to the invention, which is contacted with the relief plug-in connector 10b according to the invention, embodied as a male header. Both sections through the multilayer circuit board 12a, 12b show that the contacting sections 16a, 16b of the relief plug-in connectors 10a, 10b are implemented according to the invention as press-in contacts 22a, 22b.

The parts shown in FIGS. 2 and 3 which correspond to the parts shown in FIG. 1 each bear the same reference numerals. This convention also applies for the following figures.

The press-in contacts 22a, 22b are pressed into corresponding press-in contact receptacles 24a, 24b in the multilayer circuit board 12a, 12b in the contacted state.

Figure 4:
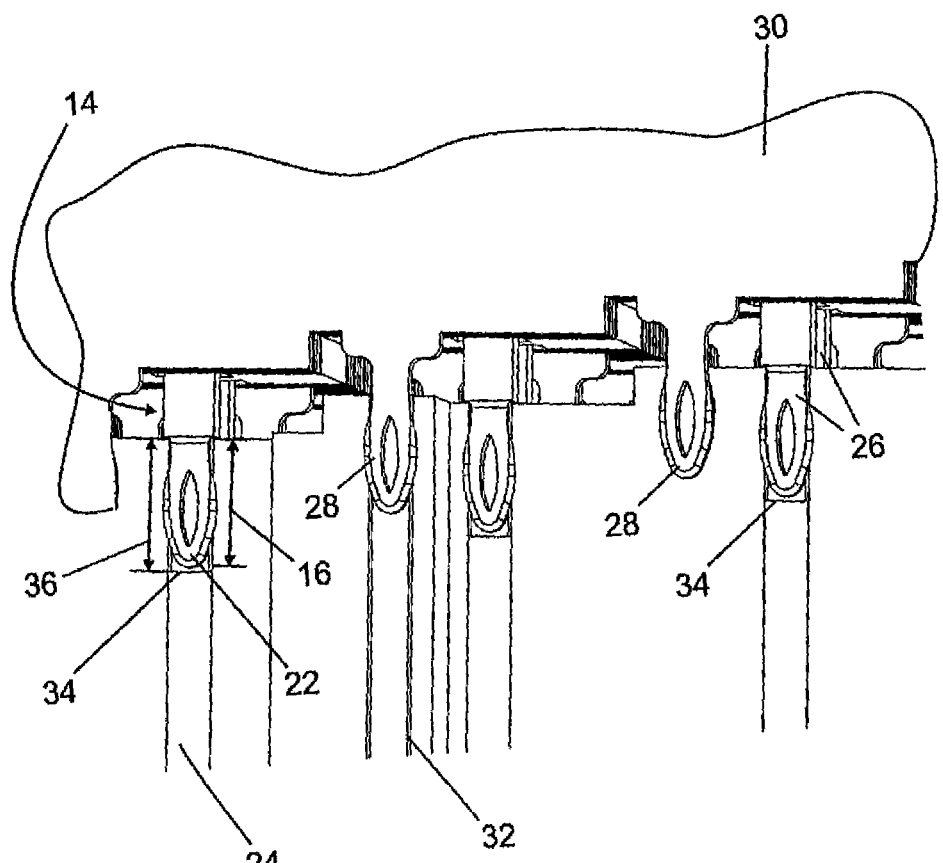
FIG. 4 shows a detail view in the area of the contacting of a multilayer circuit board according to the invention in multiple sections, which is equipped with a relief plug-in connector according to the invention.

FIG. 4 shows a greatly enlarged illustration of the press-in contacts 22, FIG. 4 illustrating the combination of the relief plug-in connector 10 according to the invention with the multilayer circuit board 12 according to the invention as an example. The differentiation between the reference sign supplements "a" and "b" is omitted. The description is to apply throughout, however, to both the plug-in connector 10a embodied as a female connector, whose components are to be designated with the reference sign supplement "a", and also for the plug-in connect or 10b embodied as a male header, whose components are to be designated with the reference sign supplement "b". This convention also applies accordingly for the following figures and the further description, respectively.

The press-in contacts 22 can be produced, for example, by stamping, a springy element resulting, which can be pressed into the press-in contact receptacle 24 of the multilayer circuit board 12.

FIG. 4 shows an embodiment in which the contacting section 16 of the press-in contacts 22 have equal lengths. Using this embodiment, the contact elements 14 having the press-in contacts 22 can be manufactured cost-effectively in the context of mass production.

FIG. 4 shows a further embodiment, according to which signal press-in contact pairs 26 are provided, which can be arranged adjacent with a preferably predefined spacing from one another. Furthermore, shielding press-in contacts 28 can be provided, which are provided, for example, for contacting electrically conductive shielding lamellae 30 provided in the plug-in connector 10. Of course, individual signal press-in contacts can be provided additionally to or instead of signal press-in contact pairs 26.

The electrical contacting in the press-in contact receptacles 24 is produced, for example, by means of electrically conductive bushes 32, 34. An advantageous embodiment is shown in which the contact elements 14 conducting the signal, for example, the signal press-in contact pairs 26, can be assigned shorter bushes 34, and the shielding press-in contacts 28 can be assigned longer bushes 32. The bushes 32, 34 therefore have predefined lengths 36.

The signal press-in contact pairs 26 allow symmetrical line guiding not only within the plug connector 10, but rather in particular also in the contacting section 16 of the press-in contacts 22, 26, 28 or in the press-in contact receptacles 24, respectively. Extremely small runtime differences between the signals may thus be implemented. Small runtime differences are particularly essential if the signal press-in contact pairs 26 conduct differential signals, for example, digital signals in the range up to 40 Gbit/s, which are still to be transmitted error-free with the most wide-open land pattern possible.

The specification of a determined differential wave impedance plays a role here, for example, 100 ohm, for a signal press-in contact pair 26, the wave impedance, whose definition can be inferred from the textbook by Meincke and Gundlach already mentioned above at the beginning, being substantially influenced through the geometric embodiment of the contact elements 14, i.e., their shape and spacing to one another, and by the dielectric material provided between the signal press-in contact pair 26. The shielding press-in contact 28 is also significant, which ensures high signal integrity together with the shielding lamellae 30.

Figure 5:
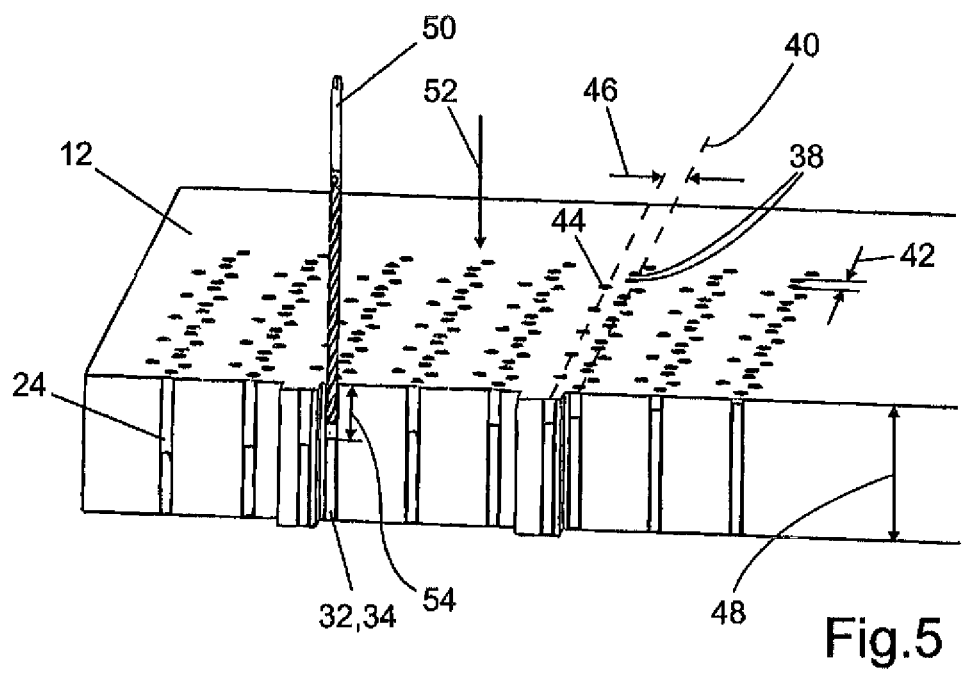
FIG. 5 shows a first step of a production method according to the invention of a multilayer circuit board according to the invention.

Geometric relationships with respect to signal press-in contact pairs 26 and shielding press-in contact 28 are illustrated in following FIG. 5, on the basis of which the first steps of the production method according to the invention of the multilayer circuit board 12a, 12b are also explained.

FIG. 5 illustrates the arrangement of the signal press-in contact pairs 26 (not shown) on the basis of the arrangement of the associated press-in contact receptacles 38. One or preferably multiple signal press-in contact pairs 26 are arranged adjacent to one another on an imaginary connecting line 40. A predefined spacing 42 is preferably respectively provided between individual signal press-in contacts of the signal press-in contact pairs 26.

The shielding press-in contacts 28 (not shown) or the corresponding shielding press-in contact receptacles 44 are preferably located with an offset 46 adjacent to the connecting line 40. Multiple shielding press-in contact receptacles 44 are preferably provided, which are then also preferably arranged on an imaginary connecting line.

The production method proceeds from a multilayer circuit board 12 having a specific height 48. The press-in contact receptacles 24, 38, 44 are drilled by means of a drill 50 in the equipping direction 52 through the entire height 48 of the multilayer circuit board 12. Subsequently, the bushes 32, 34 are produced in the press-in contact receptacles 24, 38, 44, preferably by a galvanic deposition method. The bushes 32, 34 are then preferably drilled out from the equipping side at least to a height 54, which can at least approximately correspond later to the height 54 of the affected contact area surface 20.

Figure 6:
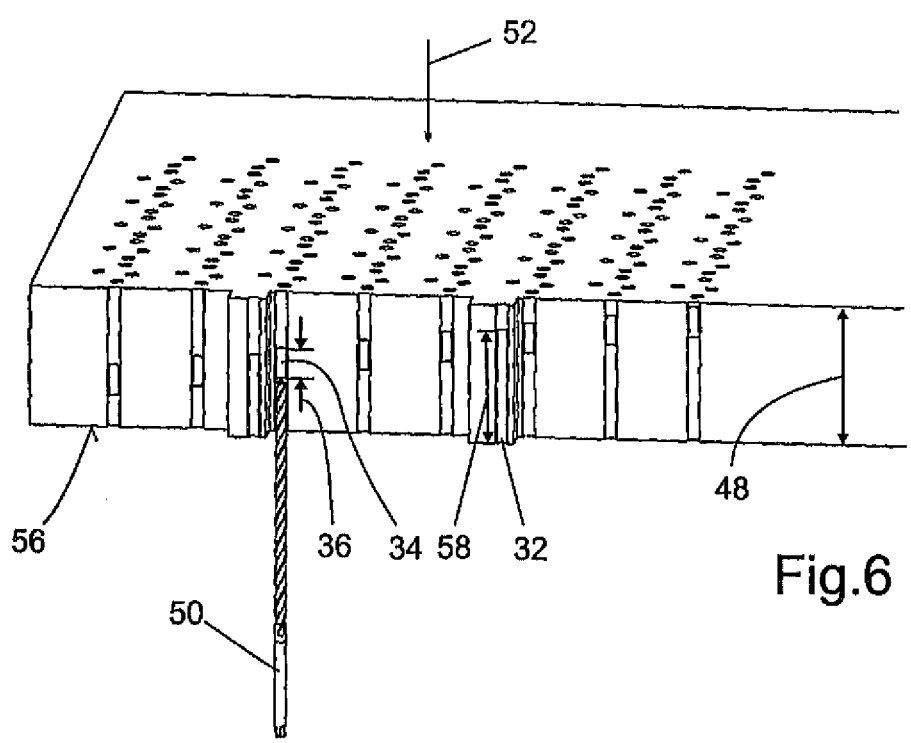
FIG. 6 shows a second step of a production method according to the invention of a multilayer circuit board according to the invention.

In the subsequent processing step, which is shown in FIG. 6, at least some bushes 34 can be drilled out opposite to the equipping direction 52 up to the predefined length 36 from the rear side 56 of the multilayer circuit board 12. The signal-conducting press-in contacts 22, 26 are preferably pressed later into these bushes 34. The undesired capacitances occurring between the press-in contact receptacles 38 are reduced by the shortening of the bushes 34.

Some bushes 32 are not drilled out from the rear side. The shielding press-in contacts 28 are preferably pressed later into these bushes 32, whose height 58 later at least approximately corresponds to the height of the contact area surface 20. The larger metallic surface of the un-shortened bushes 32 supports the shielding effect.

Figure 7:
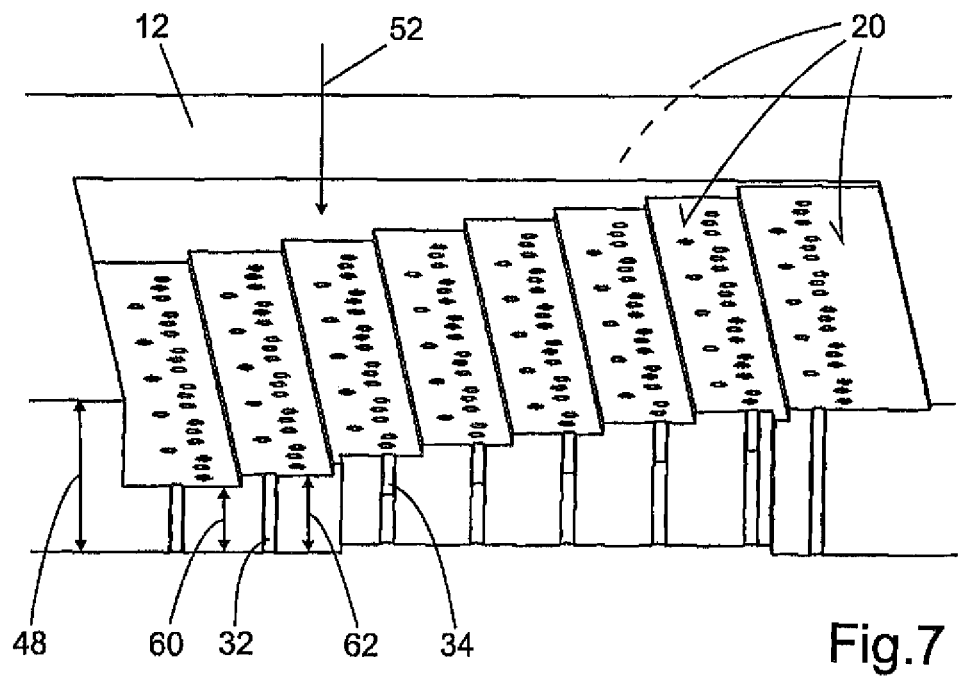
FIG. 7 shows a first embodiment of contact area surfaces of a multilayer circuit board according to the invention.
Figure 8:
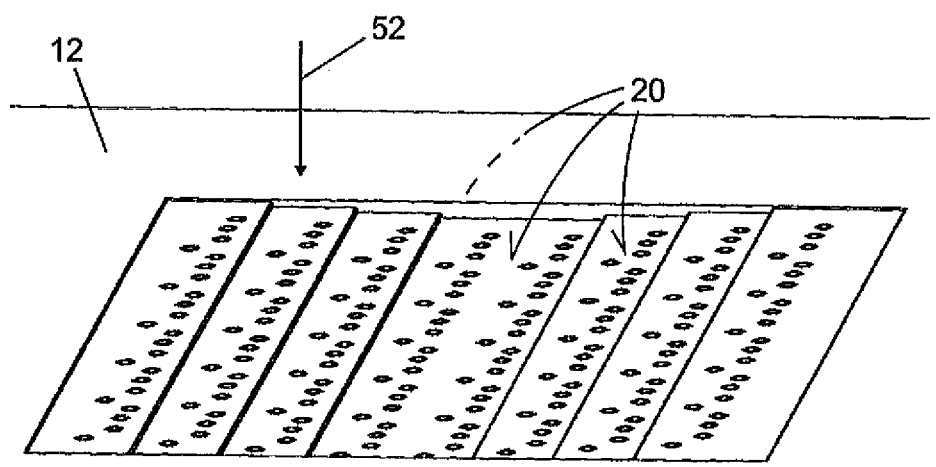
FIG. 8 shows a second embodiment of contact area surfaces of a multilayer circuit board according to the invention.

In the last processing step, the contact area surfaces 20 are produced in the various heights 58 of the multilayer circuit board 12, preferably by milling. FIGS. 7 and 8 show various possibilities for implementing the contact area surfaces 20 for this production step. According to FIG. 7, a continuously rising or continuously falling staircase is provided. Different heights 60, 62 are also indicated. Furthermore, a short bush 32 and a long bush 34 are shown in the sectional view. A rising and also falling staircase is shown according to FIG. 8.

The invention claimed is:

1. A multipolar relief plug-in connector for contacting with a multilayer circuit board, which has a plurality of contact elements, whose contacting sections are arranged in height-offset contact area surfaces forming stepped arrangements, wherein the contact elements in the contacting section are implemented as press-in contacts to be pressed into press-in contact receptacles of the multilayer circuit board, wherein the press-in contacts at least approximately have equal lengths, wherein the press-in contacts are arranged adjacent to one another in a connecting line and form signal press-in contact pairs, and wherein at least one shielding press-in contact arranged adjacent is assigned to the press-in contact pairs.

2. A multilayer circuit board to be equipped with a multipolar relief plug-in connector, which has multiple height-offset contact area surfaces forming stepped arrangements, wherein contact receptacles, which are implemented as press-in contact receptacles, are arranged in the contact area surfaces.

3. The multilayer circuit board to be equipped with a multipolar relief plug-in connector according to claim 2, wherein electrically conductive bushes for electrical contacting with the press-in contacts of the relief plug-in connectors are introduced into the press-in contact receptacles.

4. A combination of at least one multipolar relief plug-in connector and a multilayer circuit board, the relief plug-in connector having a plurality of contact elements, whose contacting sections are arranged in height-offset contact area surfaces forming stepped arrangements, and the multilayer circuit board having multiple height-offset contact area surfaces forming stepped arrangements, wherein the contact elements of the relief plug-in connector are implemented in the contacting section as press-in contacts to be pressed into press-in contact receptacles of the multilayer circuit board, and contact element receptacles, which are implemented as press-in contact receptacles, are arranged in the contact area surfaces of the multilayer circuit board.

5. The multipolar relief plug-in connector for contacting with a multilayer circuit board according to claim 1, wherein the shielding press-in contacts are arranged laterally offset with an offset in relation to the respectively assigned signal press-in contact pairs, in such a manner that they are not arranged on the connecting line.

* * * * *